(12) United States Patent
Omizo et al.

(10) Patent No.: US 8,557,635 B2
(45) Date of Patent: Oct. 15, 2013

(54) STACKED SEMICONDUCTOR DEVICE AND MANUFACTURING METHOD THEREOF

(75) Inventors: Shoko Omizo, Kawasaki (JP); Atsushi Yoshimura, Yokkaichi (JP); Fumihiro Iwami, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/403,333

(22) Filed: Feb. 23, 2012

(65) Prior Publication Data
US 2012/0223441 A1 Sep. 6, 2012

(30) Foreign Application Priority Data
Mar. 4, 2011 (JP) .................. P2011-047978

(51) Int. Cl.
*H01L 21/44* (2006.01)
(52) U.S. Cl.
USPC ............... 438/109; 438/107; 438/458
(58) Field of Classification Search
USPC ......... 438/107, 109, 113, 455, 458, 459, 460, 438/464; 257/685, 686, 777, 778
See application file for complete search history.

(56) References Cited

U.S. PATENT DOCUMENTS

| 7,208,345 | B2 * | 4/2007 | Meyer et al. ............... 438/109 |
| 7,541,217 | B1 * | 6/2009 | Shih et al. ................. 438/109 |
| 7,932,161 | B2 | 4/2011 | Apanius et al. |
| 7,932,162 | B2 * | 4/2011 | Sagara et al. .............. 438/455 |
| 7,989,943 | B2 * | 8/2011 | Kim et al. .................. 257/686 |
| 8,426,957 | B2 * | 4/2013 | Haba et al. ................. 257/686 |
| 2003/0218191 | A1 * | 11/2003 | Nordal et al. .............. 257/200 |
| 2008/0073741 | A1 | 3/2008 | Apanius et al. |
| 2008/0303131 | A1 * | 12/2008 | McElrea et al. ............ 257/686 |
| 2009/0166839 | A1 * | 7/2009 | Suzuki et al. .............. 257/686 |
| 2010/0117241 | A1 | 5/2010 | Denda |

FOREIGN PATENT DOCUMENTS

| JP | 2002-246539 | 8/2002 |
| JP | 2009-111356 | 5/2009 |
| JP | 2010-118395 | 5/2010 |
| WO | WO 2007/109326 A2 | 9/2007 |

* cited by examiner

*Primary Examiner* — Kevin M Picardat
(74) *Attorney, Agent, or Firm* — Oblon, Spivak, McClelland, Maier & Neustadt, L.L.P.

(57) ABSTRACT

In an embodiment, a first semiconductor wafer having plural first chip areas sectioned by first dicing grooves, and first photosensitive surface protection and adhesive layers provided at each of circuit surfaces of the plural first chip areas is prepared. A second semiconductor wafer having plural second chip areas sectioned by second dicing grooves, and second photosensitive surface protection and adhesive layers provided at each of circuit surfaces of the plural second chip areas is stacked with the first semiconductor wafer via the second photosensitive surface protection and adhesive layers to form plural chip stacked bodies of the first chip areas and the second chip areas.

16 Claims, 13 Drawing Sheets

STACKED SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2011-047978, filed on Mar. 4, 2011; the entire contents of which are incorporated herein by reference.

FIELD

Embodiments disclosed herein relate generally to a stacked semiconductor device and a manufacturing method thereof.

BACKGROUND

A stacked type multi-chip package in which plural semiconductor chips are stacked and sealed in one package is in practical use to enable small-sizing and high-density packaging of a semiconductor device. A stacked semiconductor device such as the stacked type multi-chip package is constituted by sequentially stacking plural semiconductor chips on a circuit substrate such as a wiring board and a lead frame. Stacking of the semiconductor chips is generally performed by using an adhesive layer formed at a non-circuit surface (rear surface) of the semiconductor chip. The stacking of the semiconductor chips is performed by a chip unit, and therefore, the number of processes required for a stacking process becomes a factor increasing a manufacturing cost of the stacked semiconductor device. It is under review to mount the plural semiconductor chips on the circuit substrate after they are stacked in advance. The number of stacking processes of the semiconductor chips is an increasing factor of the manufacturing cost also in this case.

It is studied that a surface protection and adhesive layer combining a surface protective film and an adhesive agent is formed at a circuit surface (front surface) of a semiconductor chip, and the semiconductor chips are stacked by using the surface protection and adhesive layer. A forming process of the surface protective film and a forming process of the adhesive layer becomes one process if the surface protection and adhesive layer is used, and therefore, the manufacturing cost of the stacked semiconductor device is reduced for the extent. When the surface protection and adhesive layer is used, an adhesive resin combining the surface protective material is coated on a semiconductor chip at a lower side mounted on the circuit substrate, and a semiconductor chip at an upper side is stacked and adhered thereon. In this case, opening precision and so on of electrode pads of the semiconductor chip at the lower side is easy to be lowered. Usage of the surface protection and adhesive layer having photosensitivity is also studied. However, in either case, it is the stacking by the chip unit, and therefore, the number of stacking processes becomes the increasing factor of the manufacturing cost.

DETAILED DESCRIPTION

According to an embodiment, a manufacturing method of a stacked semiconductor device is configured to include: preparing a first semiconductor wafer including plural first chip areas sectioned by first dicing grooves and each having first electrode pads formed at a circuit surface, and first photosensitive surface protection and adhesive layers provided at each of the circuit surfaces of the plural first chip areas to expose the first electrode pads; and stacking a second semiconductor wafer including plural second chip areas sectioned by second dicing grooves and each having second electrode pads formed at a circuit surface, and second photosensitive surface protection and adhesive layers provided at each of the circuit surfaces of the plural second chip areas to expose the second electrode pads, with the first semiconductor wafer via the second photosensitive surface protection and adhesive layers while facing a non-circuit surface of the first semiconductor wafer and the circuit surface of the second semiconductor wafer to form plural chip stacked bodies of the first chip areas and the second chip areas is provided. The first chip area and the second chip area are stacked in a staircase pattern to expose the second electrode pads.

First Embodiment

Figure 3:
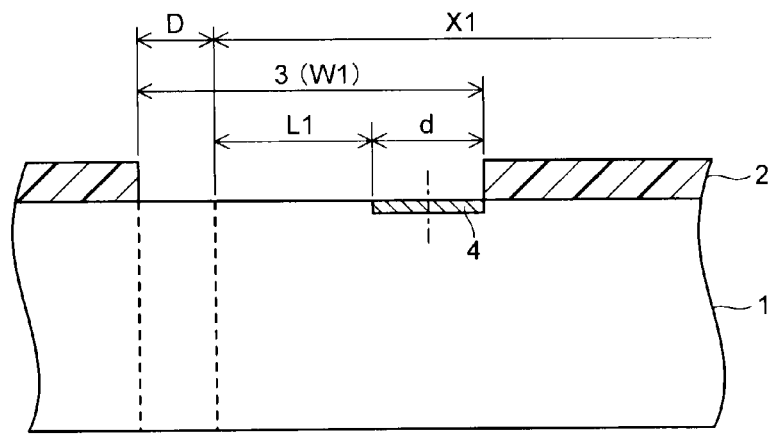
FIG. 3 is a sectional view illustrating an enlargement of a first chip area in the manufacturing method of the stacked semiconductor device illustrated in FIG. 1A to FIG. 1E.
Figure 4:
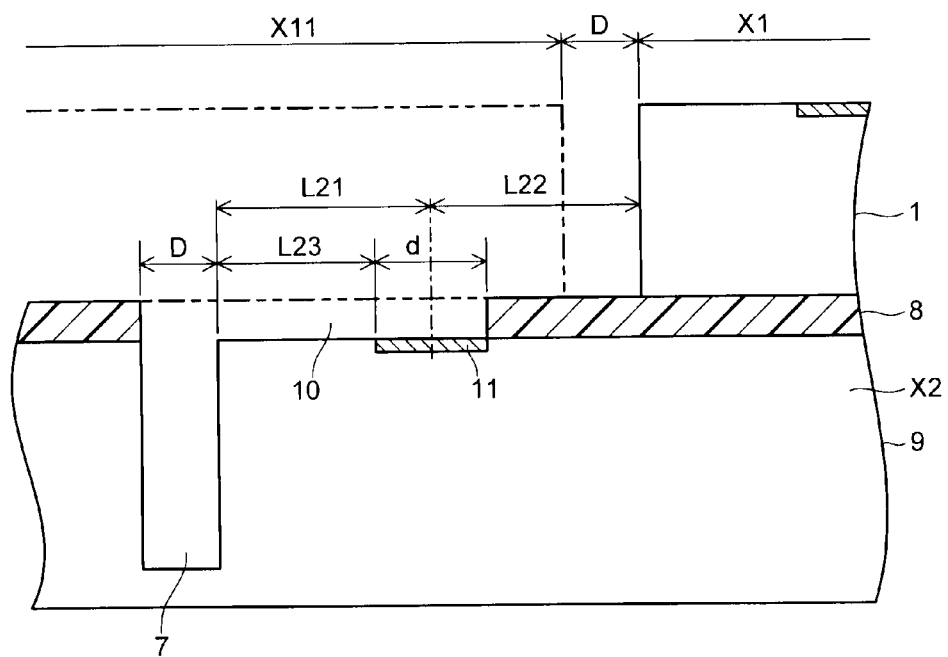
FIG. 4 is a view to explain an offset amount of a second chip area relative to the first chip area in the manufacturing method of the stacked semiconductor device illustrated in FIG. 1A to FIG. 1E.
Figure 5:
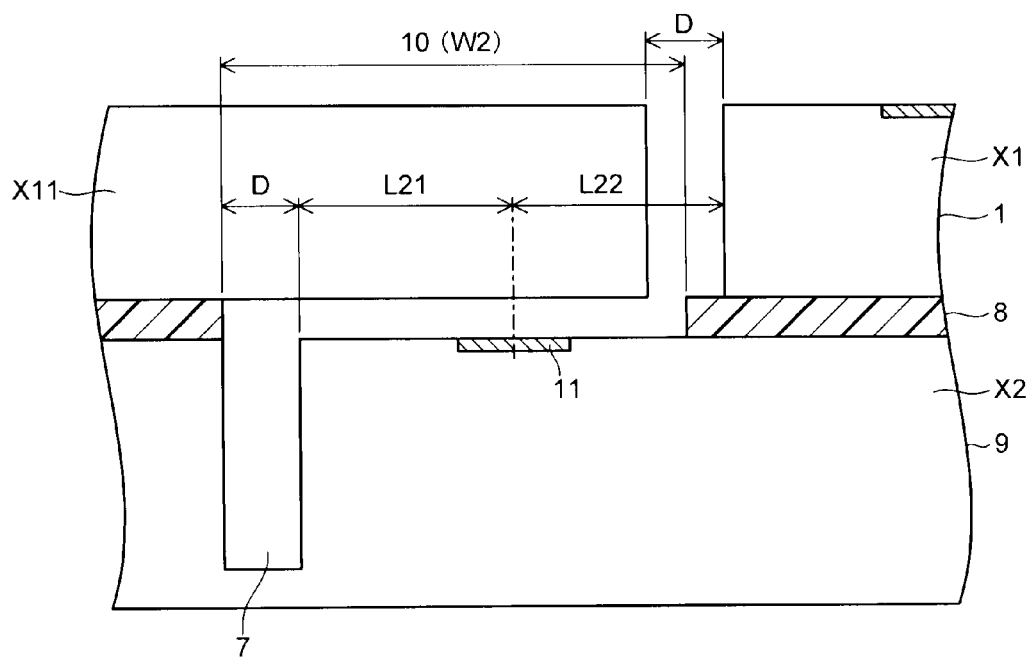
FIG. 5 is a sectional view illustrating an enlargement of a stacked state of the first semiconductor wafer and the second semiconductor wafer in the manufacturing method of the stacked semiconductor device illustrated in FIG. 1A to FIG. 1E.

FIG. 1A to FIG. 1E are views illustrating a preparation process of a first semiconductor wafer in a manufacturing method according to a first embodiment. FIG. 2A to FIG. 2E are views illustrating from a stacking process of a second semiconductor wafer to a pickup process of a chip stacked body in the manufacturing method according to the first embodiment. FIG. 3 is a view illustrating an enlargement of a first chip area in the first embodiment. FIG. 4 is a view to explain an offset amount of a second chip area relative to the first chip area in the first embodiment. FIG. 5 is a view illustrating an enlargement of a stacked state of the first chip area of the first semiconductor wafer and the second chip area of the second semiconductor wafer in the first embodiment.

Figure 1A:
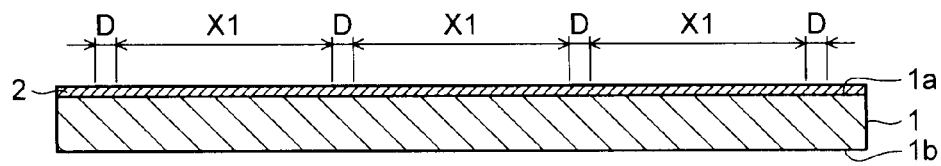
FIG. 1A to FIG. 1E are sectional views illustrating a preparation process of a first semiconductor wafer in a manufacturing method of a semiconductor device according to a first embodiment.

A first surface protection and adhesive layer 2 having photosensitivity is formed at a circuit surface (front surface) 1a of a first semiconductor wafer 1 as illustrated in FIG. 1A. The first semiconductor wafer 1 includes plural first chip areas X1, and a semiconductor element part (not-illustrated) having a semiconductor circuit, a wiring layer, and so on is formed at the circuit surface 1a of each chip area X1. Dicing areas D are each provided between the plural first chip areas X1. The first semiconductor wafer 1 is cut along the dicing areas D. Semiconductor chips corresponding to the plural chip areas X1 are manufactured by cutting the first semiconductor wafer 1 to section the first chip areas X1.

The surface protection and adhesive layer 2 protects the circuit surface (front surface) of the first chip area X1, and functions as an adhesive agent when the semiconductor chip based on the first chip area X1 is stacked with the other semiconductor chip. Further, the surface protection and adhesive layer 2 has photosensitivity, and therefore, it is possible to perform a patterning by an exposure and development process. A thermosetting or thermoplastic resin such as a phenol resin, a polyimide resin having the photosensitivity enabling the exposure and development process, and adhesiveness and re-adhesiveness enabling an adhesion between the semiconductor wafers is applied as the surface protection and adhesive layer 2 having the photosensitivity as stated above.

The first surface protection and adhesive layer 2 is formed by coating a resin composition having, for example, the photosensitivity, the adhesiveness, the re-adhesiveness, and so on, namely, a surface protection and adhesive resin composition having the photosensitivity at the circuit surface 1a of the first semiconductor wafer 1 by a spin coating method and so on, and thereafter, drying a coating film of the resin composition (removal of a solvent and so on). For example, a resin composition containing the phenol resin for 20 mass % to 40 mass %, a photosensitive material for 10 mass % or less, a surface active agent for 10 mass % or less, and a solvent for 30 mass % to 80 mass %, a resin composition containing the phenol resin for 30 mass % to 80 mass %, the photosensitive material for 10 mass % or less, a crosslinking agent for 20 mass % to 40 mass %, and the surface active agent for 10 mass % or less, and so on can be cited as a forming material of the surface protection and adhesive layer 2.

Figure 1B:
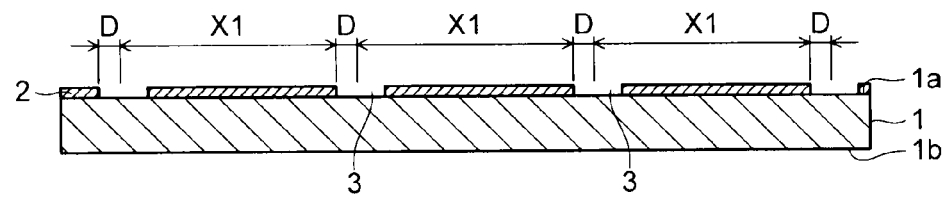

Next, the surface protection and adhesive layer 2 is exposed by using a photomask having a desired pattern, and thereafter, the development process is performed with a developing solution in accordance with a kind and properties of the surface protection and adhesive layer 2 to form openings 3 at the surface protection and adhesive layer 2 as illustrated in FIG. 1B. The openings 3 are formed to expose the dicing areas D of the semiconductor wafer 1. An electrode pad 4 having a diameter d is provided at the circuit surface of the chip area X1 as illustrated in FIG. 3. The electrode pad 4 is disposed at a position in which an end part thereof keeps off from an end part of the first chip area X1 for a distance L1. FIG. 3 is a sectional view, and therefore, only one electrode pad 4 is illustrated, but plural electrode pads 4 are arranged along an outer edge of the semiconductor chip based on the chip area X1.

The electrode pad 4 becomes a connection part with the other semiconductor chip and the circuit substrate such as the wiring board and the lead frame. Accordingly, the opening 3 exposing the electrode pad 4 is formed at the first surface protection and adhesive layer 2. The first surface protection and adhesive layer 2 has the openings 3 exposing the dicing areas D and the electrode pads 4. A concrete opening width W1 of the opening 3 of the first surface protection and adhesive layer 2 corresponds to a sum (D+L1+d) of a width of the dicing area D, the distance L1 from the end part of the first chip area X1 to the end part of the electrode pad 4, and the diameter d of the electrode pad 4. The opening width W1 of the opening 3 is a distance from the outer edge of the chip area X1 where the electrode pad 4 is arranged to an end part of the first surface protection and adhesive layer 2.

Figure 1C:
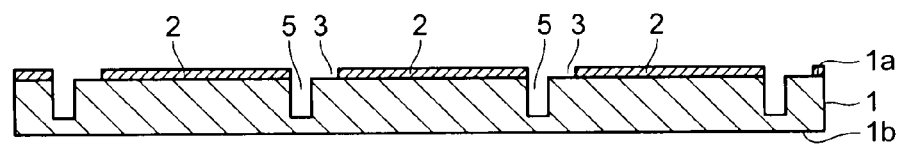

Next, grooves 5 are formed at the first semiconductor wafer 1 from the circuit surface (front surface) 1a as illustrated in FIG. 1C. The groove 5 is formed by grinding the dicing area D in which the first surface protection and adhesive layer 2 is removed by the opening 3 with, for example, a blade having a blade thickness in accordance with the width thereof. A depth of the groove 5 is set to be shallower than a thickness of the first semiconductor wafer 1, and deeper than a thickness of the semiconductor chip when it is completed. Namely, the grooves 5 in half-cut states are formed at the first semiconductor wafer 1. The groove 5 may be formed by etching and so on. The grooves (dicing grooves) 5 with the depth as stated above are formed at the first semiconductor wafer 1, and thereby, the plural chip areas X1 are each divided under a state in accordance with the completion thickness of the semiconductor chip.

Figure 1D:
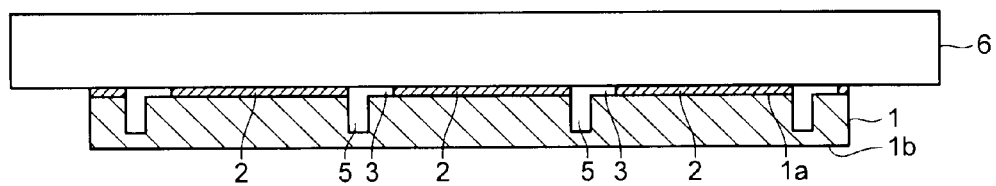

Next, a supporting substrate 6 is attached to the circuit surface 1a of the first semiconductor wafer 1 in which the dicing grooves 5 in the half-cut states are formed via the first surface protection and adhesive layer 2 as illustrated in FIG. 1D. The supporting substrate 6 has a not-illustrated viscous layer, and the supporting substrate 6 is attached to the circuit surface 1a of the first semiconductor wafer 1 via the first surface protection and adhesive layer 2 by using the viscous layer. The supporting substrate 6 functions as a holder when a non-circuit surface (rear surface) 1b of the semiconductor wafer 1 is grinded at a post process, and it maintains a shape of the semiconductor wafer 1 (wafer shape) after the chip areas X1 are separated into pieces at the grinding process of the non-circuit surface 1b. A semiconductor substrate, a glass substrate, a ceramics substrate, a resin substrate, and so on is used as the supporting substrate 6.

Figure 1E:
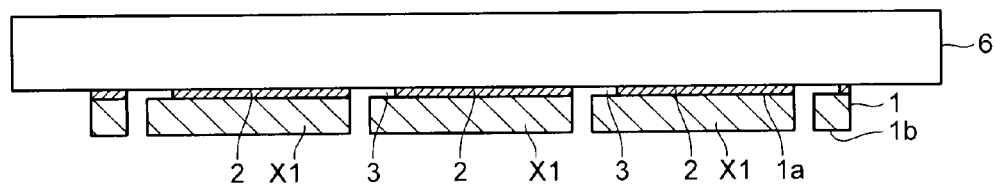

Next, the non-circuit surface (rear surface) 1b of the first semiconductor wafer 1 held by the supporting substrate 6 is grinded and polished as illustrated in FIG. 1E. The non-circuit surface 1b of the semiconductor wafer 1 is mechanically grinded by using, for example, a wrapping plate, and subsequently polished (for example, dry-polishing) by using a polishing plate. The grinding and polishing process of the non-circuit surface 1b of the semiconductor wafer 1 is performed to reach the dicing grooves 5 formed from the circuit surface 1a. The non-circuit surface 1b of the first semiconductor wafer 1 is grinded as stated above, and thereby, the plural chip areas X1 are each separated into pieces. The division of the semiconductor wafer 1 is performed by so-called a dicing before grinding process.

At this stage, the semiconductor wafer 1 maintains the wafer shape thereof as a whole because the semiconductor wafer 1 is held by the supporting substrate 6 though the plural chip areas X1 are separated into pieces. As illustrated in FIG. 1E, the first semiconductor wafer 1 having the plural first chip areas X1 sectioned by the dicing grooves 5 and the first surface protection and adhesive layers 2 provided at each of the first chip areas X1 is manufactured. The wafer shape of the first semiconductor wafer is maintained as a whole shape. The first surface protection and adhesive layer 2 is formed to expose the electrode pad 4 provided at the chip area X1. Gaps corresponding to widths of the dicing grooves 5 exist between the separated chip areas X1. The manufacturing process of the first semiconductor wafer 1 is not limited to the dicing before grinding process, but a dicing process using laser light and so on may be applied.

Figure 2A:
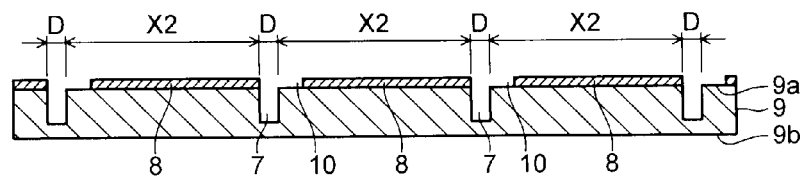
FIG. 2A to FIG. 2E are sectional views illustrating from a stacking process of a second semiconductor wafer to a pickup process of a chip stacked body in the manufacturing method of a stacked semiconductor device according to the first embodiment.

Next, a second semiconductor wafer 9 having dicing grooves 7 in half-cut states, plural second chip areas X2 divided by the dicing grooves 7, and second surface protection and adhesive layers 8 provided at each of circuit surfaces of the second chip areas X2 is prepared as illustrated in FIG. 2A. The second semiconductor wafer 9 as stated above is manufactured by sequentially performing a forming process of the surface protection and adhesive layer 8 (FIG. 1A), an exposure and development process of the surface protection and adhesive layer 8 (FIG. 1B), and a half-dicing process of the second semiconductor wafer 9 (FIG. 1C) as same as the manufacturing process of the first semiconductor wafer 1 illustrated in FIG. 1A to FIG. 1E. The second surface protection and adhesive layer 8 is made of the similar resin material as the first surface protection and adhesive layer 2, and has the similar functions, properties, and so on.

Electrode pads (not-illustrated in FIG. 2A to FIG. 2E) are provided at circuit surfaces of the chip areas X2 of the second semiconductor wafer 9 as same as the chip areas X1 of the first semiconductor wafer 1. Accordingly, openings 10 are formed at the second surface protection and adhesive layer 8 to expose the dicing areas D and the electrode pads as same as the first surface protection and adhesive layer 2. As it is described later, a circuit surface 9a of the second semiconductor wafer 9 is adhered to the non-circuit surface 1b of the first semiconductor wafer 1 under an offset state at a post process. Accordingly, it is preferable that a shape of the opening 10 is a shape including an offset amount of the second semiconductor wafer 9. It is described later as for this point.

Figure 2B:
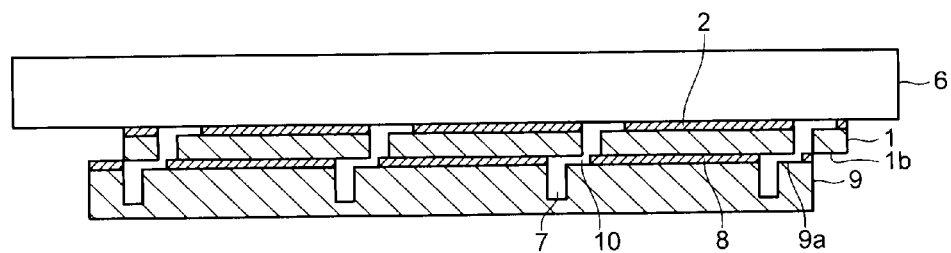

The second semiconductor wafer 9 having the dicing grooves 7 in the half-cut states is stacked with the first semiconductor wafer 1 held by the supporting substrate 6 as illustrated in FIG. 2B. The stacking of the second semiconductor wafer 9 and the first semiconductor wafer 1 is performed by adhering the circuit surface 9a of the second semiconductor wafer 9 to the non-circuit surface 1b of the first semiconductor wafer 1 by using the second surface protection and adhesive layers 8 provided at each of the circuit surfaces of the chip areas X2 of the second semiconductor wafer 9.

The second surface protection and adhesive layer 8 functions as an adhesive agent adhering the second semiconductor wafer 9 to the first semiconductor wafer 1 in addition to a function protecting the circuit surfaces of the second chip areas X2. The first semiconductor wafer 1 and the second semiconductor wafer 9 are adhered by a process in accordance with a kind and properties of the surface protection and adhesive layer 8, for example, by a curing process, a thermo-compression bonding process, and so on. When three or more pieces of semiconductor wafers are stacked, an adhesive process such as the curing process may be performed after all of the semiconductor wafers are stacked.

A stacking process of the first semiconductor wafer 1 and the second semiconductor wafer 9 is performed to form plural chip stacked bodies of the first chip areas X1 and the second chip areas X2. It is necessary for the second chip area X2 to enable a connection to the electrode pad by means of a wire bonding and so on under a state stacked at downward of the first chip area X1. Accordingly, the first chip area X1 and the second chip area X2 are stacked in a staircase pattern to expose the electrode pad. The second chip area X2 is stacked under the offset state relative to the first chip area X1.

The offset amount of the second chip area X2 is described with reference to FIG. 4 and FIG. 5. An electrode pad 11 having the diameter d is formed at the circuit surface of the second chip area X2 as same as the first chip area X1. The electrode pad 11 is disposed at a position where a center thereof keeps off from an end part of the second chip area X2 for a distance L21. Further, it is necessary to dispose the first chip area X1 at a position of a distance L22 from the center of the electrode pad 11 while considering an extra distance and so on for a diameter of a bonding tool and a deviation of a stacked position so that the first chip area X1 does not prevent raising/lowering of the bonding tool (a capillary and so on) when metal wires for connection are bonded to the electrode pad 11.

Accordingly, the offset amount of the second chip area X2 relative to the first chip area X1 is a sum (L21+L22) of the distance L21 from the end part of the second chip area X2 to the center of the electrode pad 11 and the distance L22 from the center of the electrode pad 11 to the end part of the first chip area X1. For example, when the diameter d of the electrode pad 11 is set to be 100 μm, the second chip area X2 is disposed to be offset for 310 μm from the end part of the first chip area X1 if the distance L21 from the end part of the second chip area X2 to the center of the electrode pad 11 is set to be 180 μm and the distance L22 from the center of the electrode pad 11 to the end part of the first chip area X1 required for the wire-bonding is set to be 130 μm. It is thereby possible to achieve the wire-bonding for the electrode pad 11 of the second chip area X2 which is stacked with the first chip area X1 in the staircase pattern.

Incidentally, if a shape of the opening 10 of the second surface protection and adhesive layer 8 is set to be the similar shape as the opening 3 of the first surface protection and adhesive layer 2, an opening width of the opening 10 becomes a distance in which the width of the dicing area D, a distance L23 from the end part of the second chip area X2 to the end part of the electrode pad 11, and the diameter d of the electrode pad 11 are added. Namely, the second surface protection and adhesive layer 8 is formed at a position of [the distance L23+the diameter d] from the end part of the second chip area X2. The opening width of the opening 10 may be determined by considering the width of the dicing area D and the distance (L23+d) from the end part of the second chip area X2 required for exposing the electrode pad 11 to secure a wire-bonding property relative to the electrode pad 11 of the second chip area X2.

The second chip area X2 is offset relative to the first chip area X1 in one chip stacked body stacked in the staircase pattern, and therefore, the first chip area X1 does not adversely affect on the second chip area X2. However, there is a case when a first chip area X11 of the other chip stacked body (illustrated by a two-dot chain line in the drawing) adjacent at the second electrode pad 11 side positions on the second chip area X2 depending on the offset amount of the second chip area X2. Accordingly, not only the first chip area X1 to be an original stacked chip but also a part of the first chip area X11 of the adjacent chip stacked body is adhered on the second chip area X2 by the surface protection and adhesive layer 8 depending on the shape of the opening 10. There is a possibility that a later-described pickup process of the chip stacked body is adversely affected.

It is preferable that the opening 10 of the second surface protection and adhesive layer 8 has a shape exposing the dicing area D and the second electrode pad 11, and not overlapping with the first chip area X11 of the other chip stacked body adjacent at the second electrode pad 11 side as illustrated in FIG. 5. A concrete opening width W2 of the opening 10 of the second surface protection and adhesive layer 8 is preferable to be set wider than a value (D+L21+L22−D) in which the dicing area D of the first semiconductor wafer 1 is subtracted from the sum of the width of the dicing area D of the second semiconductor wafer 9 and the offset amount (L21+L22) of the second chip area X2.

When the dicing area D of the first semiconductor wafer 1 and the dicing area D of the second semiconductor wafer 9 are equal, the opening width W2 of the opening 10 is preferable to be set wider than the offset amount (L21+L22) of the second chip area X2. The opening width W2 of the opening 10 of the second surface protection and adhesive layer 8 is preferable to be set wider than the opening width W1 of the opening 3 of the first surface protection and adhesive layer 2. It is prevented that a part of the first chip area X11 of the adjacent other chip stacked body is adhered to the second surface protection and adhesive layer 8. Accordingly, it becomes possible to finely pick-up plural chip stacked bodies which are adjacently disposed.

The adhesion of the first chip area X11 of the other chip stacked body by the second surface protective film and adhesion layer 8 is also able to be prevented by enough widening the dicing area D. Incidentally, the number of the chip areas X1, X2 capable of being formed at the semiconductor wafers 1, 9 decreases drastically in this case because the dicing areas D are widened. This becomes a factor increasing the manufacturing cost of the stacked semiconductor device. It is possible to improve a pickup capability of the plural chip stacked bodies without increasing the manufacturing cost of the stacked semiconductor device by setting the opening width W2 of the opening 10 wider than the offset amount of the second chip area X2.

Figure 2C:
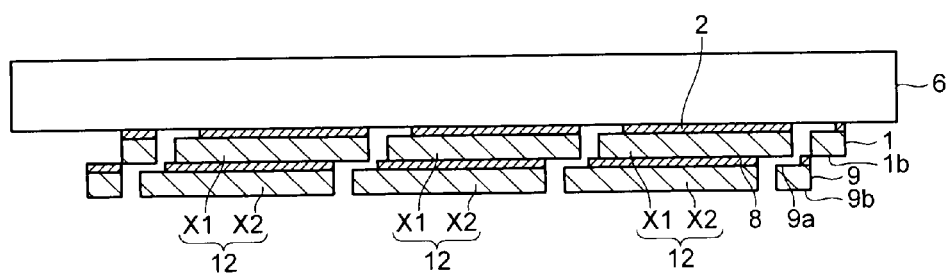

Next, a non-circuit surface (rear surface) 9b of the second semiconductor wafer 9 held by the supporting substrate 6 via the first semiconductor wafer 1 is grinded as illustrated in FIG. 2C. The grinding of the non-circuit surface 9b of the second semiconductor wafer 9 is performed as same as the first semiconductor wafer 1. The non-circuit surface (rear surface) 9b of the second semiconductor wafer 9 is grinded, and thereby, the chip areas X2 are each separated into pieces. Note that the second semiconductor wafer 9 is held by the supporting substrate 6 via the first semiconductor wafer 1, and therefore, a wafer shape thereof is maintained as a whole.

The circuit surface 9a of the second semiconductor wafer 9 having the second chip areas X2 sectioned by the dicing grooves (gaps based on the grooves) 7 and the second surface protection and adhesive layers 8 provided at each of the second chip areas X2 is adhered to the non-circuit surface 1b of the first semiconductor wafer 1 via the second surface protection and adhesive layers 8 so that plural chip stacked bodies each made up of the first chip area X1 and the second chip area X2 exposing the first and second electrode pads 4, 11 are formed.

As stated above, plural chip stacked bodies 12 in which the first chip area X1 of the first semiconductor wafer 1 and the second chip area X2 of the second semiconductor wafer 9 are each stacked are manufactured. The chip stacked bodies 12 are manufactured by stacking the first semiconductor wafer 1 and the second semiconductor wafer 9, and therefore, they are manufactured collectively in accordance with the number of formed chip areas X1, X2 at the first and second semiconductor wafers 1, 9. Namely, the stacking of the first chip areas X1 and the second chip areas X2 is performed as a wafer level, and therefore, it is possible to reduce the number of processes and the cost required for the stacking of the chips. Further, the dicing before grinding process is applied for the division of the semiconductor wafers 1, 9, and therefore, the number of processes required for reattaching and so on of the semiconductor wafer 9 is able to be reduced.

Figure 2D:
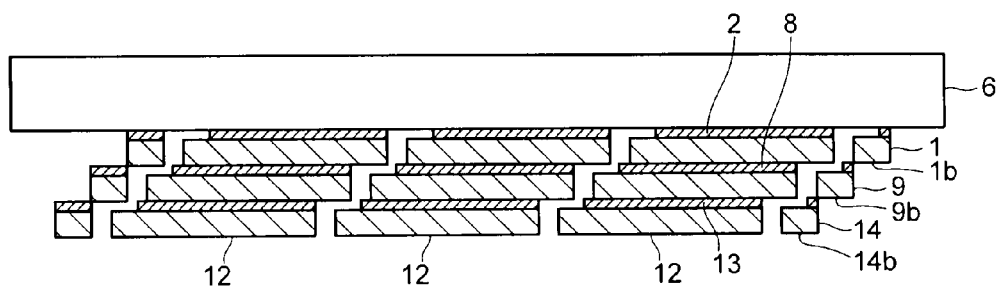

When the chip stacked body 12 is made up of the first chip area X1 and the second chip area X2, a stacked object of the first semiconductor wafer 1 and the second semiconductor wafer 9 is transferred to the pickup process of the chip stacked body 12. When the chip stacked body 12 in which three or more pieces of chips are stacked is manufactured, the preparation process of the semiconductor wafer (FIG. 2A), the stacking process of the semiconductor wafers (FIG. 2B), and the grinding process of the non-circuit surface of the semiconductor wafer (FIG. 2C) are performed repeatedly, and thereby, a third semiconductor wafer 14 is adhered to the non-circuit surface 9b of the second semiconductor wafer 9 via a third surface protection and adhesive layer 13 as illustrated in FIG. 2D. The processes as stated above are repeated, and thereby, the chip stacked body 12 in which the required number of chips are stacked can be obtained.

Figure 2E:
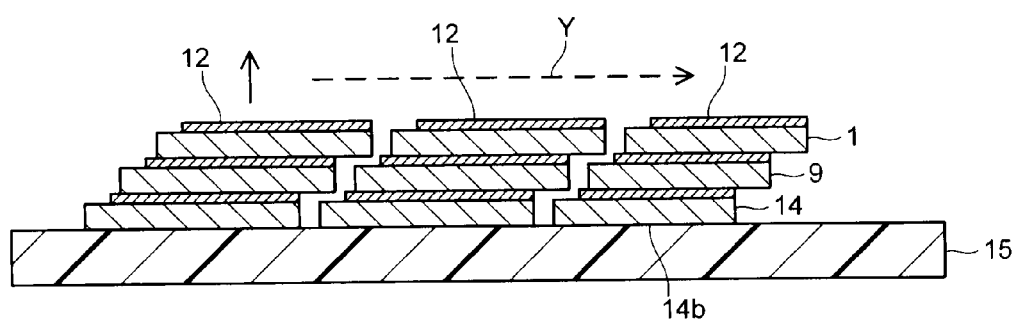

In the pickup process of the chip stacked body 12, the stacked object of the semiconductor wafers is attached to a support sheet 15 for pickup. FIG. 2E illustrates stacked objects of the first, second and third semiconductor wafers 1, 9, 14. Specifically, the support sheet 15 is attached to a non-circuit surface 14b of the third semiconductor wafer 14 being a semiconductor wafer at a lowermost step. For example, an ultraviolet curable viscous tape is used for the support sheet 15. A tape in which a viscous layer composed of an ultraviolet curable resin is formed at a base material sheet composed of a polyolefin resin, a polyvinyl chloride resin and so on such as polyethylene and polypropylene is exemplified as the ultraviolet curable viscous tape.

After the supporting substrate 6 is peeled off from the stacked object of the semiconductor wafers, the plural chip stacked bodies 12 are sequentially picked up from the support sheet 15. Stiffness of the chip stacked body 12 is increased in accordance with the number of stacked chips, and therefore, occurrences of cracks, chips and so on are suppressed compared to a case when the semiconductor chip is picked up one by one. Further, a push-up speed at the pickup time can be improved, and therefore, the number of processes required for the pickup can be reduced.

The pickup of the chip stacked body 12 is preferable to be performed sequentially in the same direction as a staircase direction of the chip stacked body 12, namely, a direction from a lower side chip to an upper side chip of stacked plural chip areas X. In FIG. 2E, an arrow Y represents a pickup order of the chip stacked bodies 12. An occurrence of a pickup failure caused by interference and so on of adjacent chip stacked body 12 is suppressed. It is not applied in a case when it is possible to enough extend intervals between the chip stacked bodies 12 by stretching the support sheet 15.

Figure 6:
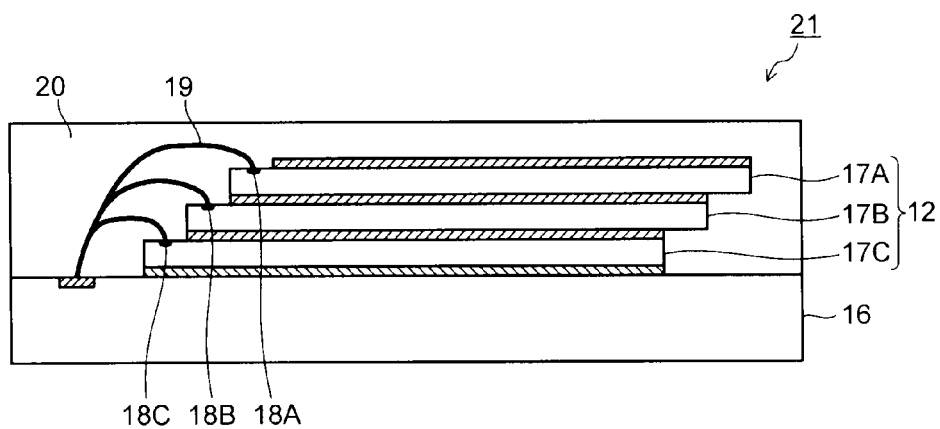
FIG. 6 is a sectional view illustrating a first configuration example of a semiconductor package applying the manufacturing method of the stacked semiconductor device according to the first embodiment.

The chip stacked body 12 picked up from the support sheet 15 is, for example, mounted on a wiring board 16 as illustrated in FIG. 6. Electrode pads 18A, 18B, 18C of plural semiconductor chips 17A, 17B, 17C constituting the chip stacked body 12 and the wiring board 16 are electrically connected via metal wires 19. The chip stacked body 12 is sealed by a sealing resin layer 20 together with the metal wires 19. A semiconductor package 21 is constituted by the above. Not-illustrated external electrodes are provided at a lower surface of the wiring board 16. Various kinds of publicly known constitutions can be applied for the semiconductor package 21. A lead frame may be applied for the circuit substrate to which the chip stacked body 12 is mounted instead of the wiring board 16.

Figure 7:
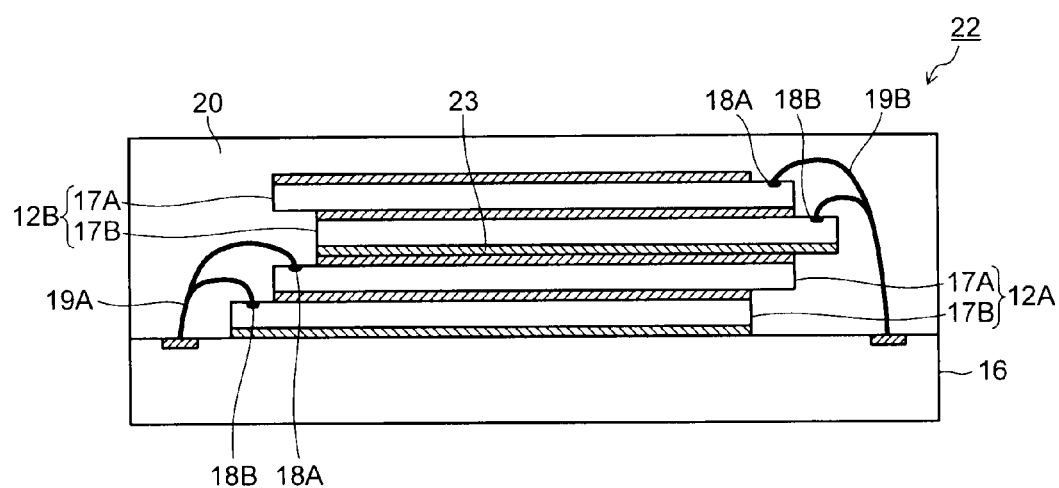
FIG. 7 is a sectional view illustrating a second configuration example of a semiconductor package applying the manufacturing method of the stacked semiconductor device according to the first embodiment.

A semiconductor package 22 may have two-steps or more of chip stacked bodies 12A, 12B in which the staircase direction is reversed at a halfway as illustrated in FIG. 7. Each of the first and second chip stacked bodies 12A, 12B includes plural semiconductor chips 17A, 17B. The electrode pads 18A, 18B of the semiconductor chips 17A, 17B constituting the first chip stacked body 12A and the wiring board 16 are electrically connected via first metal wires 19A, and thereafter, the second chip stacked body 12B is stacked on the first chip stacked body 12A.

Figure 8A:
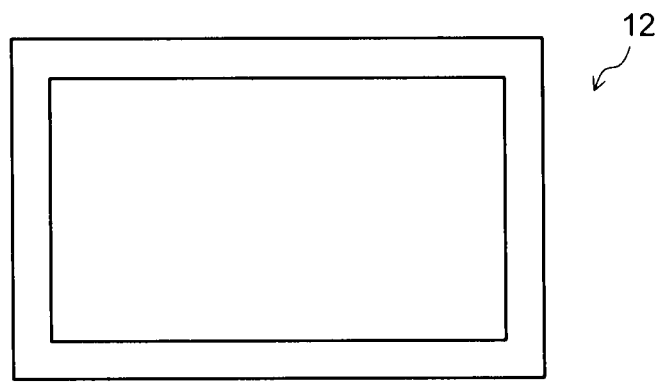
FIG. 8A and FIG. 8B are sectional views illustrating a third configuration example of the chip stacked body manufactured by applying the manufacturing method of the stacked semiconductor device according to the first embodiment.
Figure 8B:
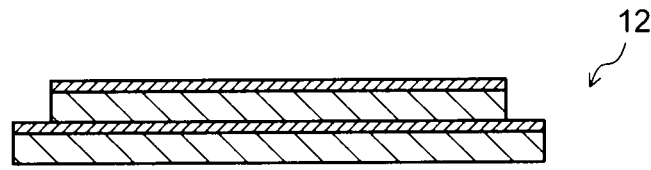
Figure 9A:
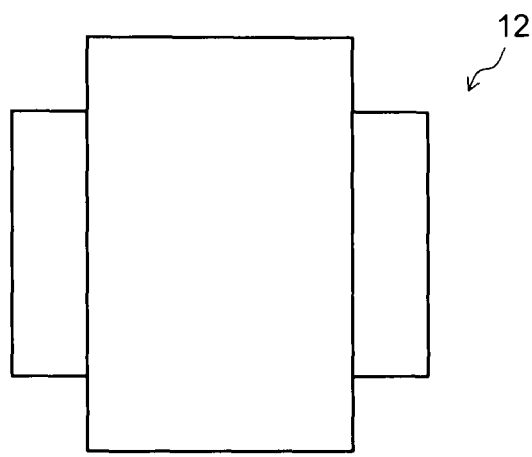
FIG. 9A and FIG. 9B are sectional views illustrating a fourth configuration example of the chip stacked body manufactured by applying the manufacturing method of the stacked semiconductor device according to the first embodiment.
Figure 9B:
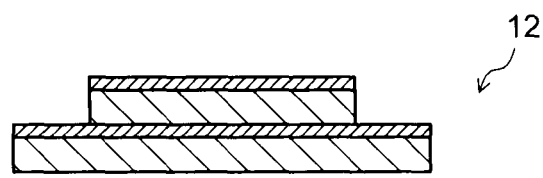

A surface protection and adhesive layer provided at a surface of the semiconductor chip 17A positioning at an uppermost of the first chip stacked body 12A is cured before the wire bonding is achieved for the first chip stacked body 12A, and therefore, an adhesion of the first chip stacked body 12A and the second chip stacked body 12B is performed by using an adhesive agent 23 coated or attached on the semiconductor chip 17A at the uppermost of the first chip stacked body 12A. Namely, the first chip stacked body 12A and the second chip stacked body 12B are adhered by using the adhesive agent 23 which is different from the surface protection and adhesive layer provided at the surface of the semiconductor chip 17A. Further, it is possible to obtain the chip stacked body 12 as illustrated in FIG. 8 and the chip stacked body 12 as illustrated in FIG. 9 by devising the shapes of the chip area and the dicing area of the semiconductor wafer, the stacking direction of the semiconductor wafers and so on.

Second Embodiment

Figure 10A:
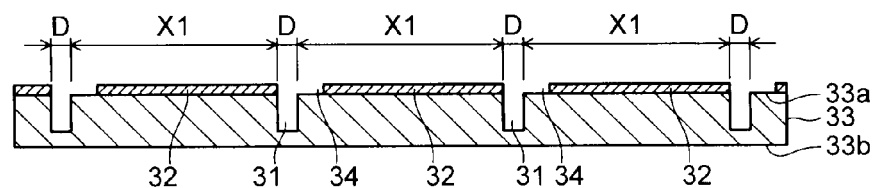
FIG. 10A to FIG. 10D are sectional views illustrating a preparation process of a first semiconductor wafer in a manufacturing method of a stacked semiconductor device according to a second embodiment.

FIG. 10A to FIG. 10D are views illustrating a preparation process of a first semiconductor wafer in a manufacturing method according to a second embodiment. FIG. 11A to FIG. 11E are views illustrating from a stacking process of a second semiconductor wafer to a pickup process of a chip stacked body in the manufacturing method according to the second embodiment. In the second embodiment, a first semiconductor wafer 33 having dicing grooves 31 in half-cut states, plural first chip areas X1 divided by the dicing grooves 31, and first surface protection and adhesive layers 32 provided at each of circuit surfaces 33a of the first chip areas X1 is prepared as illustrated in FIG. 10A.

The first semiconductor wafer 33 is manufactured as same as the preparation process of the first and second semiconductor wafers 1, 9 in the first embodiment. Namely, the forming process of the surface protection and adhesive layer illustrated in FIG. 1A, the exposure and development process of the surface protection and adhesive layer illustrated in FIG. 1B, and the half-dicing process of the semiconductor wafer illustrated in FIG. 1C are sequentially performed to thereby manufacture the first semiconductor wafer 33. The first surface protection and adhesive layer 32 is formed by the resin material having the photosensitivity and the adhesiveness as same as the surface protection and adhesive layers 2, 8 used in the first embodiment, and has the similar functions, properties, and so on.

Not-illustrated electrode pads are provided at the circuit surfaces 33a of the chip areas X1 of the first semiconductor wafer 33. Openings 34 are formed at the first surface protection and adhesive layer 32 to expose dicing areas D and the electrode pads. In the second embodiment, the first semiconductor wafer 33 is disposed at a lower side, and a non-circuit surface of a semiconductor wafer at an upper side is adhered to the circuit surface 33a. Accordingly, a shape of the opening 34 of the first semiconductor wafer 33 is preferable to be a shape including an offset amount of the semiconductor wafer at a second step. A concrete shape of the opening 34 is described later.

Figure 10B:
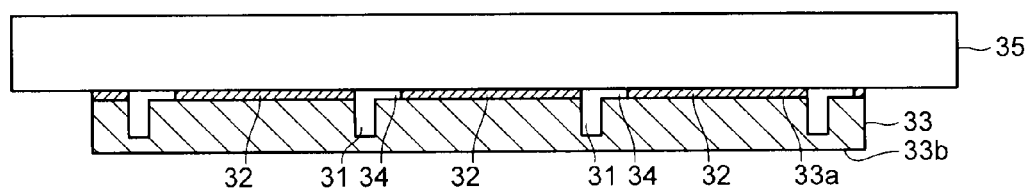

A supporting substrate 35 is attached to the circuit surface 33a of the first semiconductor wafer 33 having the dicing grooves 31 in half-cut states via the first surface protection and adhesive layers 32 as illustrated in FIG. 10B. The supporting substrate 35 functions as a holder when a non-circuit surface (rear surface) 33b of the semiconductor wafer 33 is grinded, and maintains a shape of the semiconductor wafer 33 after the chip areas X1 are separated into pieces at the grinding process. A semiconductor substrate, a glass substrate, a ceramics substrate, a resin substrate, and so on is used as the supporting substrate 35.

Figure 10C:
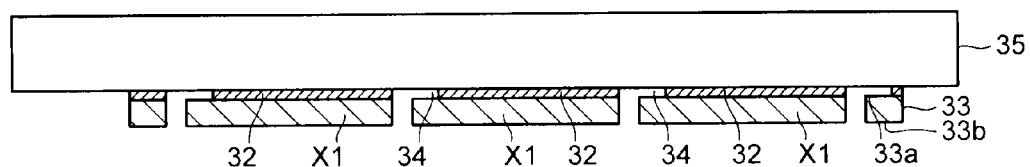

Next, the non-circuit surface (rear surface) 33b of the first semiconductor wafer 33 held by the supporting substrate 35 is grinded as illustrated in FIG. 10C. The grinding of the semiconductor wafer 33 is performed as same as the first embodiment. The non-circuit surface 33b of the first semiconductor wafer 33 is grinded, and thereby, plural chip areas X1 are each separated into pieces. So-called a dicing before grinding process is applied for the division of the first semiconductor wafer 33. At this stage, a wafer shape of the first semiconductor wafer 33 is maintained as a whole because the first semiconductor wafer 33 is held by the supporting substrate 35 though the respective chip areas X1 are separated into pieces.

As illustrated in FIG. 10C, the first semiconductor wafer 33 having the plural first chip areas X1 sectioned by the dicing grooves 31 and the surface protection and adhesive layers 32 provided at each of the chip areas X1 is manufactured. The wafer shape of the first semiconductor wafer 33 is maintained as a whole shape. The first surface protection and adhesive layer 32 has the opening 34 exposing the electrode pad provided at the chip area X1. The manufacturing process of the first semiconductor wafer 33 is not limited to the dicing before grinding process, but a dicing process using laser light and so on may be applied.

Figure 10D:
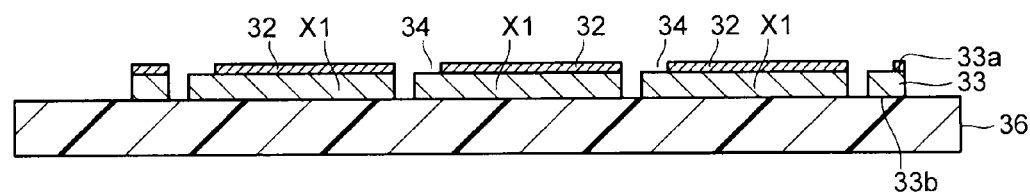

As illustrated in FIG. 10D, the non-circuit surface 33b of the first semiconductor wafer 33 having the sectioned plural chip areas X1 is attached to a support sheet 36 for pickup, and thereafter, the supporting substrate 35 is peeled off. For example, an ultraviolet curable viscous tape is used for the support sheet 36. A tape in which a viscous layer composed of an ultraviolet curable resin is formed at a base material sheet composed of a polyolefin resin, a polyvinyl chloride resin and so on such as polyethylene and polypropylene is exemplified as the ultraviolet curable viscous tape.

Figure 11A:
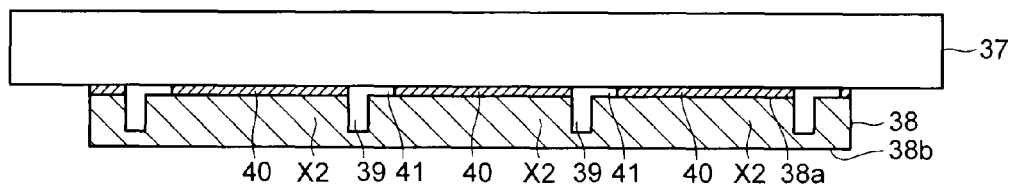
FIG. 11A to FIG. 11E are sectional views illustrating from a stacking process of a second semiconductor wafer to a pickup process of a chip stacked body in the manufacturing method of the stacked semiconductor device according to the second embodiment.

A second semiconductor wafer 38 is held by a supporting substrate 37 as illustrated in FIG. 11A by performing the similar process as the manufacturing process of the first semiconductor wafer 33. The second semiconductor wafer 38 has dicing grooves 39 in half-cut states, plural second chip areas X2 divided by the dicing grooves 39, and second surface protection and adhesive layers 40 provided at each of circuit surfaces 38a of the second chip areas X2. A not-illustrated electrode pad is provided at the circuit surface 38a of the chip area X2. Openings 41 are formed at the second surface protection and adhesive layer 40 to expose dicing areas and the electrode pads.

Figure 11B:
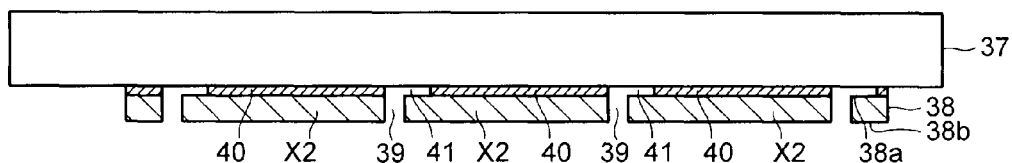

Next, a non-circuit surface (rear surface) 38b of the second semiconductor wafer 38 held by the supporting substrate 37 is grinded as illustrated in FIG. 11B, and thereby, plural chip areas X2 are each separated into pieces. In FIG. 11B, the second semiconductor wafer 38 has the plural second chip areas X2 sectioned by the dicing grooves 39 and the second surface protection and adhesive layers 40 provided at each of the second chip areas X2. A whole shape of the second semiconductor wafer 38 is maintained by the supporting substrate 37. The second surface protection and adhesive layer 40 is formed by the resin material similar to the first surface protection and adhesive layer 32, and has similar functions, properties, and so on.

Figure 11C:
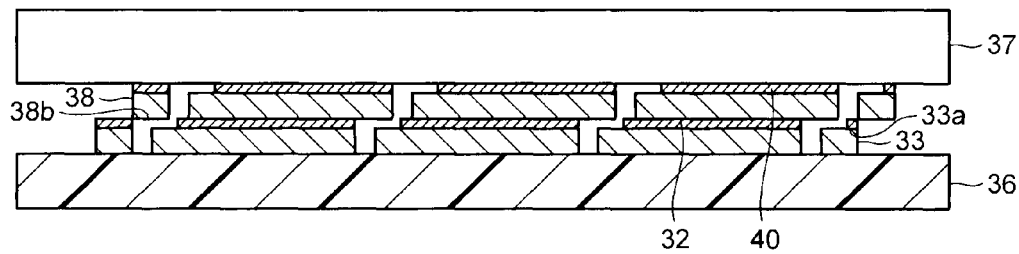

The second semiconductor wafer 38 having the plural second chip areas X2 is stacked on the first semiconductor wafer 33 held by the support sheet 36 as illustrated in FIG. 11C. The stacking of the first semiconductor wafer 33 and the second semiconductor wafer 38 is performed by adhering the non-circuit surface 38b of the second semiconductor wafer 38 to the circuit surface 33a of the first semiconductor wafer 33 by using the first surface protection and adhesive layers 32 provided at the circuit surfaces 33a of the chip areas X1. The adhesion of the first semiconductor wafer 33 and the second semiconductor wafer 38 by using the surface protection and adhesive layers 32 is preferable to be performed as same as the first embodiment.

The stacking of the first semiconductor wafer 33 and the second semiconductor wafer 38 is performed to form plural chip stacked bodies each made up of the first chip area X1 and the second chip area X2. It is necessary for the first chip area X1 to achieve the wire bonding to the electrode pad under a state stacking the second chip area X2 at upward thereof. The first chip area X1 and the second chip area X2 are stacked in a staircase pattern to expose the electrode pad. Namely, the second chip area X2 is stacked under the offset state relative to the first chip area X1. An offset amount of the second chip area X2 is preferable to be set as same as the first embodiment.

The offset amount of the second chip area X2 relative to the first chip area X1 is set to be a distance capable of achieving the wire bonding to the electrode pad disposed at a predetermined position from an end part of the first chip area X1 under the state of the chip stacked body. The offset amount of the second chip area X2 becomes a sum of a distance from the end part of the first chip area X1 to a center of the electrode pad (corresponding to the distance L21 in FIG. 5) and a distance from the center of the electrode pad to an end part of the second chip area X2 (corresponding to the distance L22 in FIG. 5) which enables the wire bonding.

The opening 34 of the first surface protection and adhesive layer 32 is preferable to have a shape exposing the dicing area D and the electrode pad of the first chip area X1, and not overlapping with the second chip area X2 of the other chip stacked body adjacent at the electrode pad side. An opening width of the opening 34 is preferable to be set wider than the offset amount of the second chip area X2 as same as the first embodiment. The opening width of the opening 34 is preferable to be set wider than an opening width of an opening 41 of the second surface protection and adhesive layer 40. It is prevented that a first chip area X of the other chip stacked body adjacent thereto is adhered to the first surface protection and adhesive layer 32. Accordingly, it becomes possible to finely pickup the plural chip stacked bodies.

Figure 11D:
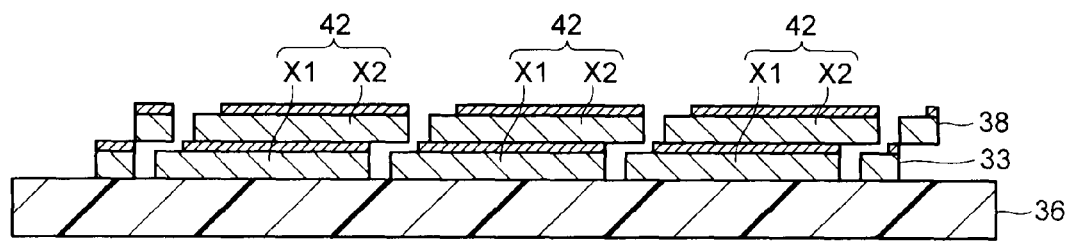

As illustrated in FIG. 11D, the supporting substrate 37 is peeled off from the second semiconductor wafer 38. Plural chip stacked bodies 42 in which the chip areas X1 of the first semiconductor wafer 33 and the chip areas X2 of the second semiconductor wafer 38 are stacked are manufactured as stated above. The plural chip stacked bodies 42 are manufactured by stacking the first semiconductor wafer 33 and the second semiconductor wafer 38, and therefore, they are manufactured collectively in accordance with the number of formed chip areas X1, X2 at the first and second semiconductor wafers 33, 38. The stacking of the first chip areas X1 and the second chip areas X2 are performed as a wafer level, and therefore, the plural chip stacked bodies 42 are collectively manufactured. Accordingly, it is possible to reduce the number of processes and the cost required for the stacking of the chips.

Figure 11E:
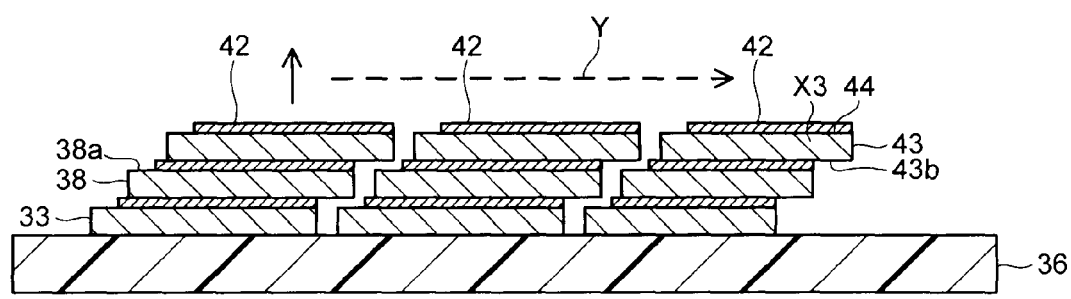

When the chip stacked body 42 is made up of the first chip area X1 and the second chip area X2, a stacked object of the first semiconductor wafer 33 and the second semiconductor wafer 38 is transferred to the pickup process of the chip stacked bodies 42. When the chip stacked body 42 in which three or more pieces of chips are stacked is manufactured, the manufacturing process of the semiconductor wafer (FIG. 11A to FIG. 11B), the stacking process of the semiconductor wafers (FIG. 11C), and the peeling process of the supporting substrate 37 (FIG. 11D) are performed repeatedly, and thereby, a non-circuit surface 43b of a third semiconductor wafer 43 is adhered to the circuit surface 38a of the second semiconductor wafer 38 as illustrated in FIG. 11E. The third semiconductor wafer 43 has plural chip areas X3 and a surface protection and adhesive layer 44 as same as the first and second semiconductor wafers 33, 38. The processes as stated above are repeated, and thereby, the chip stacked body 42 in which the required number of chips are stacked can be obtained.

The chip stacked bodies 42 are sequentially picked up from the support sheet 36 as illustrated in FIG. 11E. Stiffness of the chip stacked body 42 is increased in accordance with the number of stacked chips, and therefore, occurrences of cracks, chips and so on are suppressed compared to a case when the semiconductor chip is picked up one by one. A push-up speed at the pickup time can be improved, and therefore, the number of processes required for the pickup and so on can be reduced. The pickup of the chip stacked body 42 is preferable to be performed sequentially in a direction which is the same direction as a staircase direction of the chip stacked body 42 as indicated by an arrow Y. An occurrence of a pickup failure caused by interference and so on of adjacent chip stacked body 42 is suppressed. It is not applied in a case when it is possible to enough extend intervals between the chip stacked bodies 42 by stretching the support sheet 36.

The chip stacked body 42 picked up from the support sheet 36 is mounted on a circuit substrate such as a wiring board and a lead frame as same as the first embodiment. A structure of the semiconductor package including the chip stacked bodies 42 is as same as the first embodiment. It is also possible to stack two-steps or more of chip stacked bodies while the staircase direction is reversed at a halfway. The manufacturing process in this case is that the chip stacked body at the lower side is mounted on the circuit substrate, the wire bonding is achieved, and thereafter, the chip stacked body at the upper side is stacked as same as the first embodiment. Further, it is also possible to obtain the chip stacked bodies as illustrated in FIG. 8 and FIG. 9 by devising shapes and so on of the chip area and the dicing area of the semiconductor wafer.

Third Embodiment

Figure 12:
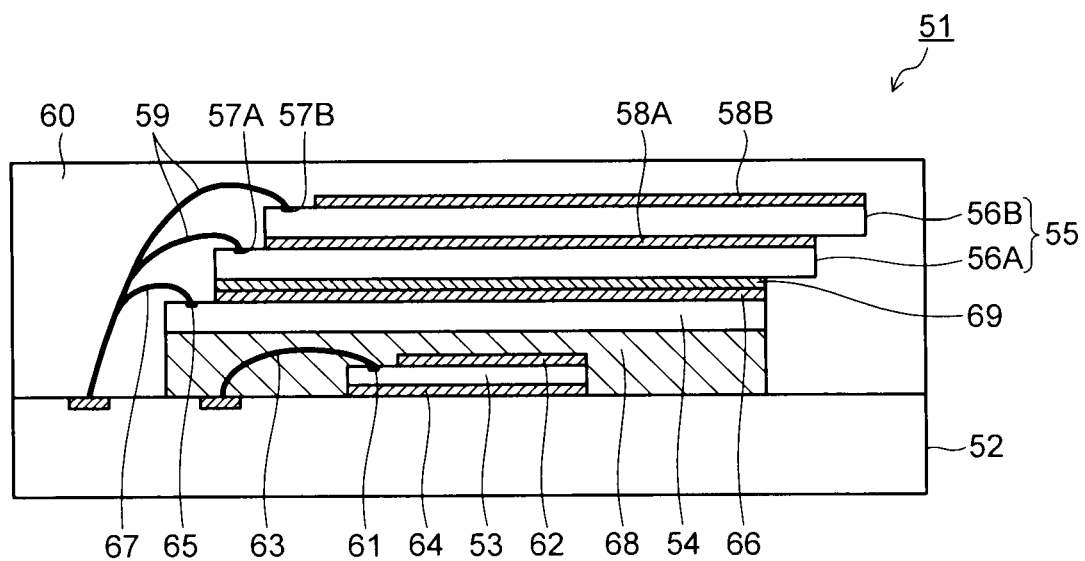
FIG. 12 is a sectional view illustrating a stacked semiconductor device according to a third embodiment.

FIG. 12 is a view illustrating a stacked semiconductor device according to a third embodiment. A stacked semiconductor device 51 illustrated in FIG. 12 includes a first and a second semiconductor chip 53, 54 sequentially stacked on a wiring board 52, and a chip stacked body 55 disposed on the second semiconductor chip 54. The chip stacked body 55 is made up of two semiconductor chips 56A, 56B. The chip stacked body 55 is manufactured by the manufacturing method according to the first embodiment or the manufacturing method according to the second embodiment. The number of stacked semiconductor chips 56 is not limited to two, and it may be three or more.

The semiconductor chips 56A, 56B have electrode pads 57A, 57B and surface protection and adhesive layers 58A, 58B provided at each of circuit surfaces. The surface protection and adhesive layers 58A, 58B have openings exposing the electrode pads 57A, 57B as it is described in the first and second embodiments. The electrode pads 57A, 57B are electrically connected to the wiring board 52 via metal wires 59. The semiconductor chips 53, 54, and the chip stacked body 55 are sealed by a sealing resin layer 60 formed on the wiring board 52.

The first semiconductor chip 53 has an electrode pad 61 and a surface protective film 62 provided at a circuit surface. The electrode pad 61 of the first semiconductor chip 53 is electrically connected to the wiring board 52 via a metal wire 63. The first semiconductor chip 53 is adhered to the wiring board 52 by an adhesive layer 64. The second semiconductor chip 54 has an electrode pad 65 and a surface protection and adhesive layer 66 provided at a circuit surface. The surface protection and adhesive layer 66 has an opening to expose the electrode pad 65. The electrode pad 65 of the second semiconductor chip 54 is electrically connected to the wiring board 52 via a metal wire 67. The second semiconductor chip 54 is adhered to the wiring board 52 by an adhesive layer 68.

The first semiconductor chip 53 is enough smaller than the second semiconductor chip 54, and therefore, it is embedded in the adhesive layer 68 of the second semiconductor chip 54. Reverse bonding is used for the metal wire 63 to reduce a wire height. The first semiconductor chip 53 is embedded in the adhesive layer 68 by melting the adhesive layer 68 with heat from the first semiconductor chip 53 and the metal wire 63. The adhesive layer 68 has a thickness capable of embedding the first semiconductor chip 53, and therefore, it is preferable to be cured by a heat treatment after the first semiconductor chip 53 is adhered to the wiring board 52 while embedding the first semiconductor chip 53. Accordingly, adhesiveness of the surface protection and adhesive layer 66 of the second semiconductor chip 54 is lost.

The chip stacked body 55 is adhered on the second semiconductor chip 54 by an adhesive layer 69 which is different from the surface protection and adhesive layer 66 of the second semiconductor chip 54. Here, a case when the first semiconductor chip 53 is embedded in the adhesive layer 68 of the second semiconductor chip 54 is described, but a usage of the adhesive layer 69 which is different from the surface protection and adhesive layer 66 is not limited to this case. For example, it is also necessary to cure the adhesive layer 68 by the heat treatment in advance when the wire bonding for the second semiconductor chip 54 is necessary to be performed before the chip stacked body 55 is disposed. The adhesiveness of the surface protection and adhesive layer 66 is lost also in this case, and therefore, the chip stacked body 55 is adhered by the adhesive layer 69 which is different from the surface protection and adhesive layer 66.

The surface protection and adhesive layer effectively functions as an adhesive layer when plural semiconductor chips are continuously stacked. It is possible to adhere the other semiconductor chip and the chip stacked body on the surface protection and adhesive layer by coating another adhesive agent or attaching an adhesive film when the adhesiveness of the surface protection and adhesive layer is lost at the time when the adhesion process and the wire bonding process of the plural semiconductor chips are performed separately. It is the same as for a semiconductor package illustrated in FIG. 7. The surface protection and adhesive layer functions as a protective film of the semiconductor chip even in this case, and therefore, effectiveness thereof in itself is not lost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a stacked semiconductor device, comprising:

preparing a first semiconductor wafer including plural first chip areas sectioned by first dicing grooves and each having first electrode pads formed at a circuit surface, and first photosensitive surface protection and adhesive layers provided at each of the circuit surfaces of the plural first chip areas to expose the first electrode pads; and stacking a second semiconductor wafer including plural second chip areas sectioned by second dicing grooves and each having second electrode pads formed at a circuit surface, and second photosensitive surface protection and adhesive layers provided at each of the circuit surfaces of the plural second chip areas to expose the second electrode pads, with the first semiconductor wafer via the second photosensitive surface protection and adhesive layers while facing a non-circuit surface of the first semiconductor wafer and the circuit surface of the second semiconductor wafer to form plural chip stacked bodies of the first chip areas and the second chip areas, wherein the first chip area and the second chip area are stacked in a staircase pattern to expose the second electrode pads.

2. The manufacturing method according to claim 1, wherein, when the chip stacked body of the first chip area and the second chip area is formed, the second photosensitive surface protection and adhesive layer is provided not to overlap with the first chip area of an other chip stacked body adjacent at the second electrode pad side.

3. The manufacturing method according to claim 1, wherein the preparing the first semiconductor wafer comprises:

holding the first semiconductor wafer having the plural first chip areas divided by the first dicing grooves in half-cut states and the first photosensitive surface protection and adhesive layers with a supporting substrate attached to the circuit surface of the first semiconductor wafer via the first photosensitive surface protection and adhesive layers; and sectioning the plural first chip areas by grinding the non-circuit surface of the first semiconductor wafer held by the supporting substrate.

4. The manufacturing method according to claim 3,
wherein the stacking the second semiconductor wafer comprises:
adhering the circuit surface of the second semiconductor wafer having the plural second chip areas divided by the second dicing grooves in half-cut states and the second photosensitive surface protection and adhesive layers to the non-circuit surface of the first semiconductor wafer held by the supporting substrate by using the second photosensitive surface protection and adhesive layers; and
sectioning the plural second chip areas by grinding the non-circuit surface of the second semiconductor wafer held by the supporting substrate via the first semiconductor wafer.

5. The manufacturing method according to claim 4,
wherein the preparing the first semiconductor wafer, further comprises:
forming the first photosensitive surface protection and adhesive layer by coating a first surface protection and adhesive resin composition having photosensitivity at the circuit surface of the first semiconductor wafer having the plural first chip areas and first dicing areas;
forming the first photosensitive surface protection and adhesive layer having first openings to expose the first dicing areas and the first electrode pads by performing an exposure and development process of a coating film of the first adhesive resin composition; and
forming the first dicing grooves in the half-cut states by grinding the exposed first dicing areas from the circuit surface of the first semiconductor wafer.

6. The manufacturing method according to claim 5,
wherein the stacking the second semiconductor wafer, further comprises:
forming the second photosensitive surface protection and adhesive layer by coating a second surface protection and adhesive resin composition having photosensitivity at the circuit surface of the second semiconductor wafer having the plural second chip areas and second dicing areas;
forming the second photosensitive surface protection and adhesive layer having second openings to expose the second dicing areas and the second electrode pads by performing an exposure and development process of a coating film of the second adhesive resin composition; and
forming the second dicing grooves in the half-cut states by grinding the exposed second dicing areas from the circuit surface of the second semiconductor wafer.

7. The manufacturing method according to claim 6,
wherein, when the chip stacked body of the first chip area and the second chip area is formed, the second opening of the second photosensitive surface protection and adhesive layer has an opening shape in which the second photosensitive surface protection and adhesive layer does not overlap with the first chip area of the other chip stacked body adjacent at the second electrode pad side.

8. The manufacturing method according to claim 7,
wherein an opening width of the second opening exposing the second dicing area and the second electrode pads is wider than an offset amount of the second chip area relative to the first chip area enabling a wire bonding to the second electrode pads at the chip stacked body.

9. The manufacturing method device according to claim 8,
wherein the opening width of the second opening is wider than an opening width of the first opening exposing the first dicing area and the first electrode pads.

10. The manufacturing method according to claim 1, further comprising:
holding a stacked object of the first semiconductor wafer and the second semiconductor wafer with a supporting tape attached to the non-circuit surface of the second semiconductor wafer;
picking up the chip stacked body from the supporting tape;
mounting the chip stacked body picked up from the supporting tape on a circuit substrate; and
electrically connecting the first and second electrode pads at the chip stacked body to the circuit substrate via metal wires.

11. The manufacturing method according to claim 1, further comprising:
holding a stacked object of the first semiconductor wafer and the second semiconductor wafer with a supporting tape attached to the non-circuit surface of the second semiconductor wafer;
picking up of the plural chip stacked bodies sequentially from the supporting tape;
mounting the first chip stacked body picked up from the supporting tape on a circuit substrate;
electrically connecting the first and second electrode pads at the first chip stacked body to the circuit substrate via first metal wires;
stacking the second chip stacked body picked up from the supporting tape on the first chip stacked body via an adhesive layer which is different from the first photosensitive surface protection and adhesive layer provided at the first chip area of the first chip stacked body; and
electrically connecting the first and second electrode pads at the second chip stacked body to the circuit substrate via second metal wires.

12. A method of manufacturing a stacked semiconductor device, comprising:
preparing a first semiconductor wafer including plural first chip areas sectioned by first dicing grooves and each having first electrode pads formed at a circuit surface, and first photosensitive surface protection and adhesive layers provided at each of the circuit surfaces of the plural first chip areas to expose the first electrode pads;
holding a second semiconductor wafer including plural second chip areas divided by second dicing grooves in half-cut states and each having second electrode pads formed at a circuit surface, and second photosensitive surface protection and adhesive layers provided at each of the circuit surfaces of the plural second chip areas to expose the second electrode pads, with a supporting substrate attached to the circuit surface of the second semiconductor wafer via the second photosensitive surface protection and adhesive layers;
sectioning the plural second chip areas by grinding a non-circuit surface of the second semiconductor wafer held by the supporting substrate; and
stacking the second semiconductor wafer on the first semiconductor wafer via the first photosensitive surface protection and adhesive layers while facing the circuit surface of the first semiconductor wafer and the non-circuit surface of the second semiconductor wafer to form plural chip stacked bodies of the first chip areas and the second chip areas,
wherein the first chip area and the second chip area are stacked in a staircase pattern to expose the first electrode pads.

13. The manufacturing method according to claim 12,
wherein the preparing the first semiconductor wafer comprises:

holding the first semiconductor wafer having the plural first chip areas divided by the first dicing grooves in half-cut states and the first photosensitive surface protection and adhesive layers with a supporting substrate attached to the circuit surface of the first semiconductor wafer via the first photosensitive surface protection and adhesive layers; and sectioning the plural first chip areas by grinding a non-circuit surface of the first semiconductor wafer held by the supporting substrate.

14. The manufacturing method according to claim 13, wherein the preparing the first semiconductor wafer, further comprises:

forming the first photosensitive surface protection and adhesive layer by coating a first surface protection and adhesive resin composition having photosensitivity at the circuit surface of the first semiconductor wafer having the plural first chip areas and first dicing areas;

forming the first photosensitive surface protection and adhesive layer having first openings to expose the first dicing areas and the first electrode pads by performing an exposure and development process of a coating film of the first adhesive resin composition; and forming the first dicing grooves in the half-cut states by grinding the exposed first dicing areas from the circuit surface of the first semiconductor wafer.

15. The manufacturing method according to claim 14, wherein, when the chip stacked body of the first chip area and the second chip area is formed, the first opening of the first photosensitive surface protection and adhesive layer has an opening shape in which the first photosensitive surface protection and adhesive layer does not overlap with the second chip area of an other chip stacked body adjacent at the first electrode pad side.

16. The manufacturing method according to claim 15, further comprising:

holding a stacked object of the first semiconductor wafer and the second semiconductor wafer with a supporting tape attached to the non-circuit surface of the first semiconductor wafer;

picking up the chip stacked body from the supporting tape;

mounting the chip stacked body picked up from the supporting tape on a circuit substrate; and electrically connecting the first and second electrode pads at the chip stacked body to the circuit substrate via metal wires.

* * * * *